United States Patent
Rekhi et al.

(10) Patent No.: US 8,264,043 B1
(45) Date of Patent: Sep. 11, 2012

(54) PROTECTION OF INTEGRATED CIRCUIT GATES DURING METALLIZATION PROCESSES

(75) Inventors: Sanjay Rekhi, Fremont, CA (US); Nagendra Cherukupalli, Cupertino, CA (US); Paul D. Keswick, Morgan Hill, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 942 days.

(21) Appl. No.: 11/411,064

(22) Filed: Apr. 25, 2006

Related U.S. Application Data

(62) Division of application No. 10/807,909, filed on Mar. 24, 2004, now Pat. No. 7,033,900.

(60) Provisional application No. 60/458,047, filed on Mar. 27, 2003.

(51) Int. Cl.
*H01L 23/60* (2006.01)

(52) U.S. Cl. .. 257/360; 257/532; 257/758; 257/E27.016

(58) Field of Classification Search .................. 438/329; 257/355, 360, E27.016, E27.024
See application file for complete search history.

(56) References Cited

U.S. PATENT DOCUMENTS

| | | | |
|---|---|---|---|
| 5,760,445 A * | 6/1998 | Diaz | 257/356 |
| 5,963,412 A | 10/1999 | En | |
| 6,117,714 A * | 9/2000 | Beatty | 438/196 |
| 6,281,737 B1 | 8/2001 | Kuang et al. | |
| 6,337,502 B1 * | 1/2002 | Eitan et al. | 257/357 |
| 6,538,868 B2 | 3/2003 | Chang et al. | |
| 6,611,453 B2 | 8/2003 | Ning | |
| 6,627,555 B2 * | 9/2003 | Eitan et al. | 438/710 |
| 7,033,900 B1 | 4/2006 | Rekhi et al. | |
| 2001/0026970 A1 * | 10/2001 | Eitan et al. | 438/215 |

OTHER PUBLICATIONS

USPTO Non-Final Rejection for U.S. Appl. No. 10/807,909 dated Mar. 29, 2005; 8 pages.
USPTO Non-Final Rejection for U.S. Appl. No. 10/807,909 dated Aug. 15, 2005; 8 pages.
USPTO Notice of Allowance for U.S. Appl. No. 10/807,909 dated Dec. 6, 2005; 4 pages.

* cited by examiner

*Primary Examiner* — David Vu
*Assistant Examiner* — Earl Taylor

(57) ABSTRACT

In one embodiment, a first transistor is configured to switch ON to discharge accumulated charges on an interconnect line during a metallization process. This advantageously protects a second transistor, which is coupled to the interconnect line, from charge buildup. The gate of the first transistor may be coupled to the interconnect line by way of a coupling capacitor. The gate of the first transistor may remain floating during the metallization process, and subsequently coupled to ground at a topmost metal level. The metallization process may be physical vapor deposition, for example.

12 Claims, 8 Drawing Sheets

PROTECTION OF INTEGRATED CIRCUIT GATES DURING METALLIZATION PROCESSES

CROSS-REFERENCE TO RELATED APPLICATION

The present application is a divisional of U.S. patent application Ser. No. 10/807,909, filed on Mar. 24, 2004 now U.S. Pat. No. 7,033,900, which claims the benefit of U.S. Provisional Application No. 60/458,047, filed on Mar. 27, 2003, both of which are hereby incorporated by reference in their entirety.

BACKGROUND OF THE INVENTION

1. Field of the Invention

The present invention relates generally to semiconductor devices, and more particularly but not exclusively to the protection of integrated circuit gates during fabrication.

2. Description of the Background Art

In the manufacture of semiconductor devices, physical vapor deposition (PVD, also known as sputtering) is commonly used to deposit thin films of metal on a silicon substrate. This process involves conversion of target material into vapor phase by ion bombardment. The bombarding ion used is typically an inert gas, such as Argon. The property of inertness is important because it does not react with other species. In order for material to become a bombarding species it must gain sufficient energy and be directed towards a target metal. The inert gas atoms gain sufficient energy through the ionization process in a plasma. A plasma or glow discharge is an energetic ionized gas generated by electric discharge in a gaseous medium. The PVD process may take ten to thirty seconds, so voltage buildup may be in the order of tens of volts in the last few seconds of the process. A PVD process in one exemplary embodiment is schematically illustrated in FIG. 1, where plasma 112 allows for deposition of metal from a target 110 onto a silicon wafer substrate 114. During this processing step, relatively high charges can buildup on existing metal layers on the silicon substrate.

As process technology advances and gate oxides of transistors are scaled down, breakdown of the oxide and reliability become a concern. Higher electric fields in the oxide increase the tunneling of carriers from the channel into the oxide, causing a charge buildup. Since the gate oxide is relatively thin, this charge buildup can destroy the gate oxide, thereby degrading transistor performance. FIG. 2 schematically illustrates this charge buildup on a gate of a logic module 103. Logic modules 102 and 103 may be part of a multi-level device. In the example of FIG. 2, interconnect lines 104 and 106 may be formed on a first metal level (also referred to as "M1"), while interconnect line 105 may be formed on a second metal level (also referred to as "M2") above the first metal.level. The formation of interconnect line 105 by PVD may result in charge buildup on interconnect line 106, which may damage module 103 and other circuits connected to interconnect line 106. This is a problem in semiconductor manufacturing processes, and may result in low yield.

A conventional technique to guard against damage to gates due to charge buildup is shown in the schematic diagram of FIG. 3. The conventional technique involves the use of reverse bias diodes, where the reverse breakdown and leakage characteristics are relied upon to discharge the accumulated charge on the gates. In FIG. 3, a diode 302 serves to protect the gate of transistor 303 from charge buildup on interconnect line 301 during a PVD process. To be effective, this technique may require the use of many diodes per interconnect line (also referred to as a "net" in a layout). The graph of FIG. 4 shows the number of diodes (also referred to as "antenna cells" or "antenna diodes") as a function of a number of nets for an example device. The first data point indicates there are 97 nets that require only 1 diode, the last data point indicates there are 6 nets that require 25 diodes, and data point 410 indicates that there are 3 nets that require 23 diodes. FIG. 5 schematically shows a layout of a conventional solution showing the relatively high number of diode cells 504 required in one exemplary embodiment. In the example of FIG. 5, five diode cells 504 protect a gate (not shown) connected to interconnect line 502, which in turn is coupled to diode cells 504 by way of interconnect lines 506 and 508. FIG. 6 shows the equivalent schematic diagram for diode cells 504. The ratio of the amount of metal area of the interconnect line to the amount of gate area to be protected determines how many diodes need to be placed on the interconnect line. Many diodes may need to be placed on long nets. These diodes load the net and continue to leak charge even during normal operation. They are costly in terms of area, power and signal propagation delay.

SUMMARY

In one embodiment, a first transistor is configured to switch ON to discharge accumulated charges on an interconnect line during a metallization process. This advantageously protects a second transistor, which is coupled to the interconnect line, from charge buildup. The gate of the first transistor may be coupled to the interconnect line by way of a coupling capacitor. The gate of the first transistor may remain floating during the metallization process, and subsequently coupled to ground at a topmost metal level. The metallization process may be physical vapor deposition, for example.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 7:
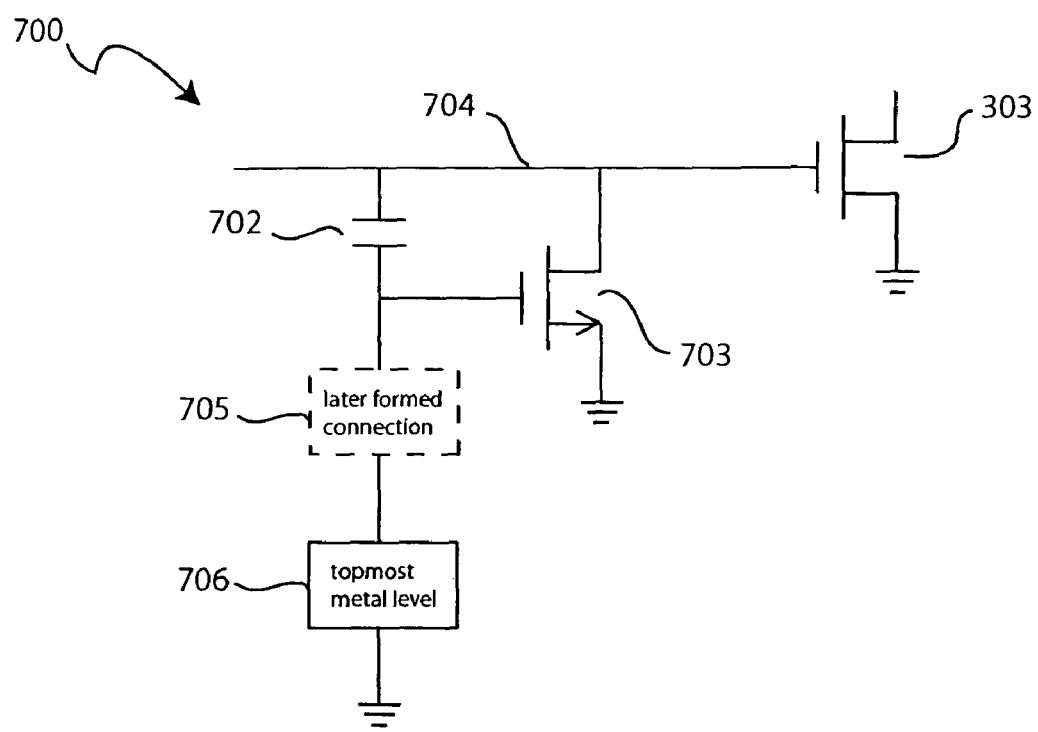
FIG. 7 shows a circuit for preventing charge buildup in accordance with an embodiment of the present invention.

FIG. 7 shows a circuit 700 for preventing charge buildup on an interconnect line in accordance with an embodiment of the present invention. In the example of FIG. 7, circuit 700 protects the gate of a transistor 303, which may be a MOS transistor. Circuit 700 may include a transistor 703 and a capacitor 702. In one embodiment, transistor 703 comprises an N-type field effect transistor (nfet) with the source connected to ground and the drain connected to the metal wire that accumulates charge, which in this example is interconnect line 704. The gate of transistor 703 may be coupled to interconnect line 704 by way of capacitor 702. The gate of transistor 703 is otherwise left floating during the manufacture of the device including transistor 303. The gate of transistor 703 may be subsequently connected to ground at a topmost metal level 706 of the device. That is, assuming interconnect line 704 is on M1 and the device has only three overlying metal levels M1, M2, and M3, the gate of transistor 703 may be left floating during the formation of M1, M2, and M3. The gate of transistor 703 may be later connected (see connection 705) to a quiet ground at M3 after M3 is formed. As will be more apparent below, circuit 700 helps protect the gate of transistor 303 by preventing charge build-up on interconnect line 704 during formation of other metal wires, such as during the formation of M2 and M3 by a metallization process (e.g., physical vapor deposition). Grounding the gate of transistor 703 at the topmost metal level at a later processing step helps prevent transistor 703 from interfering with the normal operation of transistor 303.

Figure 8:
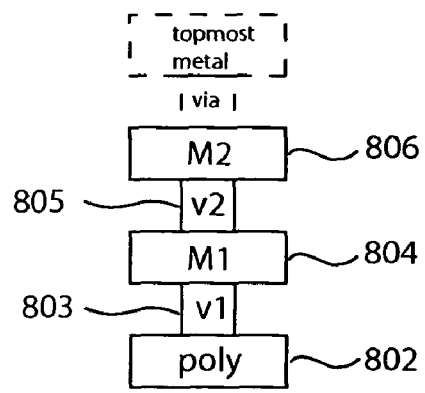
FIG. 8 schematically illustrates a stacked via structure in accordance with an embodiment of the present invention.

FIG. 8 schematically illustrates a stacked via structure in accordance with an embodiment of the present invention. In the example of FIG. 8, polysilicon 802 may comprise the gate of a charge buildup protection transistor, such as transistor 703. Polysilicon 802 may be left floating during the formation of a first metal level 804 (i.e., an M1), a second metal level 806 (i.e., an M2), and other overlying metal levels. After the formation of the topmost metal level, polysilicon 802 may be coupled to ground at the topmost metal level by way of vias 803, 805, and other vias vertically stacked one on top of another between metal levels as shown in FIG. 8.

Referring back to FIG. 7, capacitor 702 may be a designed-in coupling or a parasitic capacitor. Capacitor 702 may be designed such that transistor 703 switches ON at about the threshold voltage (i.e., $V_T$) of transistor 703 to about the power supply voltage plus 20% (i.e., $V_T$+20% of $V_{CC}$). As charge accumulates on interconnect line 704, the gate of the transistor 703 starts to develop a voltage because of capacitor 702. This causes transistor 703 to start conducting current and discharge the accumulated charge on interconnect line 704, thereby protecting the gate of transistor 303. Note that the gate of transistor 703 is floating in the aforementioned circuit analysis. As mentioned, the gate of transistor 703 may remain floating until the topmost metal level is formed.

Figure 9:
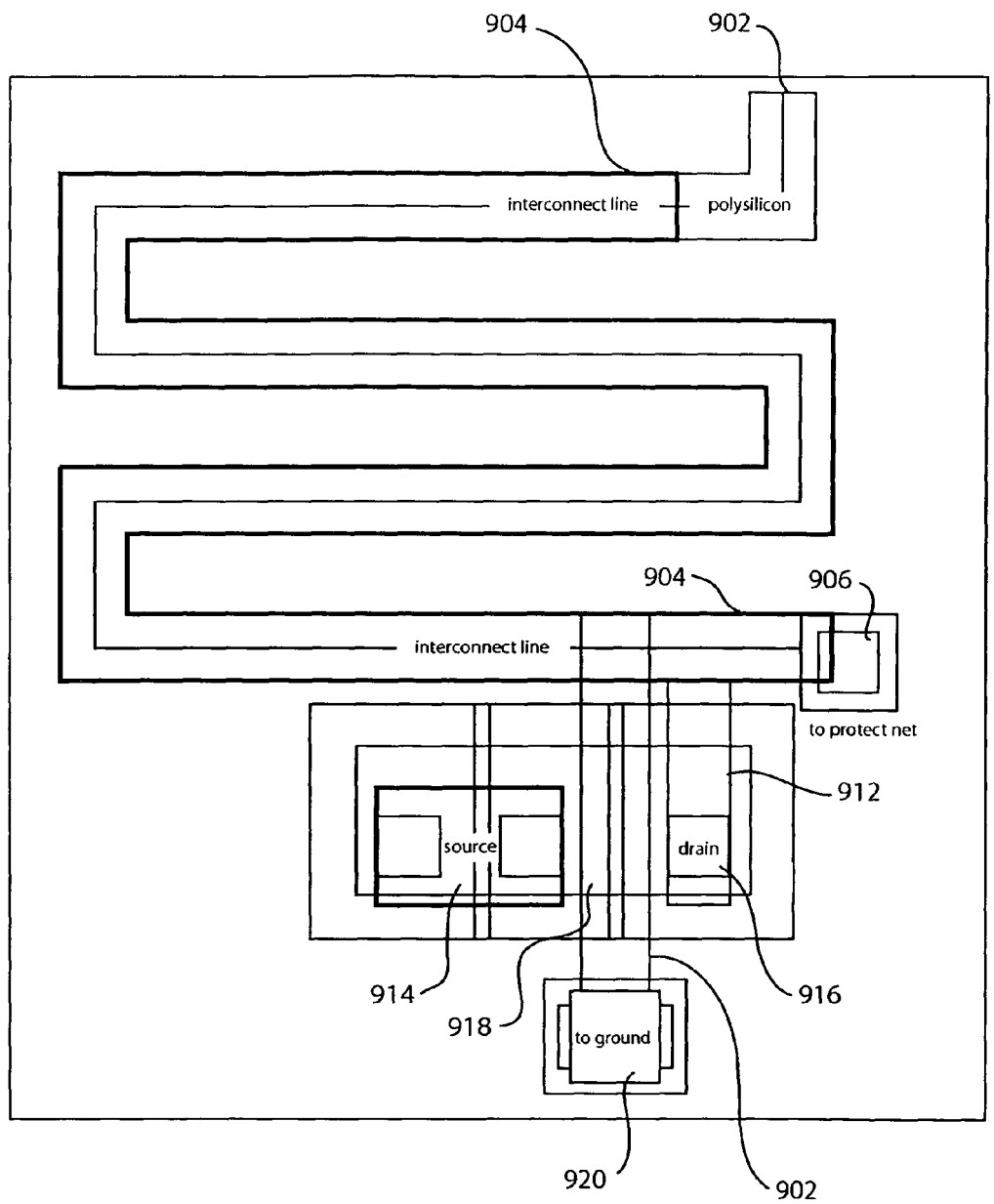
FIG. 9 schematically shows a layout of a circuit for preventing charge buildup, in accordance with an embodiment of the present invention.

Circuit 700 may be implemented as a standard cell (for example, one per technology) that may be placed in lieu of antenna diode cells. FIG. 9 schematically shows such a layout in accordance with an embodiment of the present invention. In the example of FIG. 9, polysilicon 902 may be part of or connected to the gate of the charge buildup protection transistor (e.g. transistor 703). The gate of the charge buildup protection transistor may also comprise polysilicon. The charge buildup protection transistor may include a drain region 916, a source region 914, and a diffusion region 918. Drain region 916 is connected to interconnect line 904 by way of interconnect line 912. Only one charge buildup protection transistor is shown in FIG. 9 for clarity of illustration. In most applications, only one protection transistor may be needed.

Interconnect line 904 is connected to a node 906, which is connected to the net to be protected. A designed-in coupling or parasitic capacitor (e.g., capacitor 702) is formed by interconnect line 904 over polysilicon 902. Interconnect line 904 may be on a first metal level, while polysilicon 902 may be directly under interconnect line 904 (e.g. see polysilicon 802 under first metal level 804 in FIG. 8). Interconnect line 904 and polysilicon 902 form parallel plates of the coupling capacitor. The characteristics of the coupling capacitor depends on a number of factors including the area of interconnect lines 904 and polysilicon 902, and the thickness of a dielectric layer between them.

Polysilicon 902 may be later coupled to a quiet ground on a topmost metal level by way of a via 920.

To minimize sub-threshold leakage, the length of the charge buildup protection transistor is preferably greater than the minimum allowable transistor length for the technology; for example, at least 2 times the minimum. As a particular example, if the minimum transistor length allowed is 0.13 μm (i.e., 0.13 μm technology), then the length of the charge buildup protection transistor may be about 0.26 μm or higher. In an alternate embodiment, the designed-in coupling capacitor may be removed because the gate itself will accumulate charge. In an alternate embodiment, a high-threshold device may be used, such as a metal gate used in a diode configuration (source connected to gate), to prevent charge buildup on a metal wire. However, the threshold for such a device is so high that gate oxide breakdown may occur before the device turns on, rendering this embodiment less desirable than others. Sub-threshold leakage from a minimum sized transistor may also be used to protect gates from charge buildup, but the resulting leakage may cause other problems.

Figure 1:
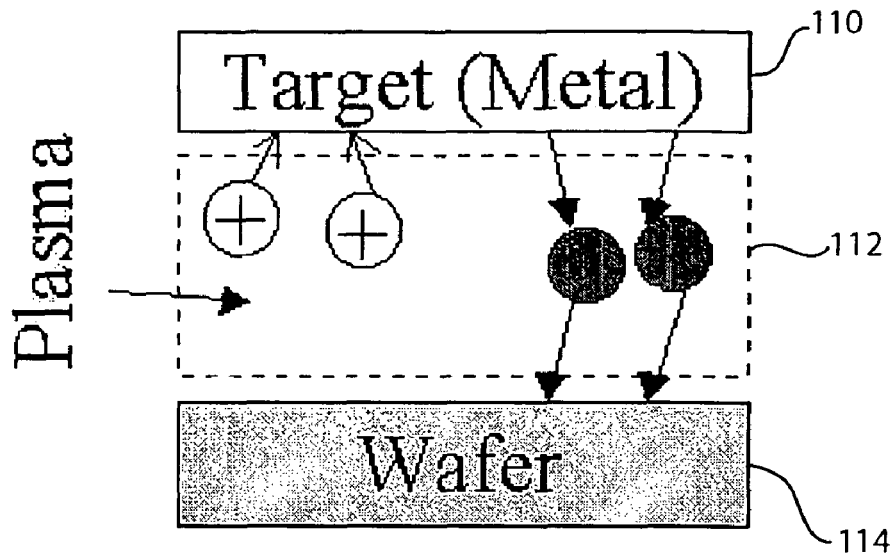
FIG. 1 schematically illustrates the operation of an example physical vapor deposition process.
Figure 2:
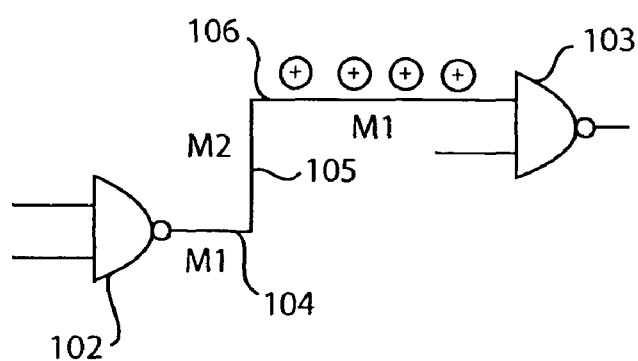
FIG. 2 schematically illustrates charge buildup on a gate of a logic module.
Figure 3:
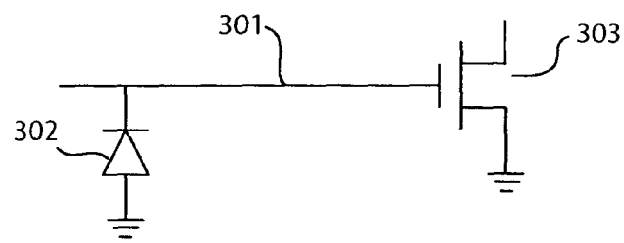
FIG. 3 shows a schematic diagram of a conventional circuit for protecting gates against charge buildup.
Figure 4:
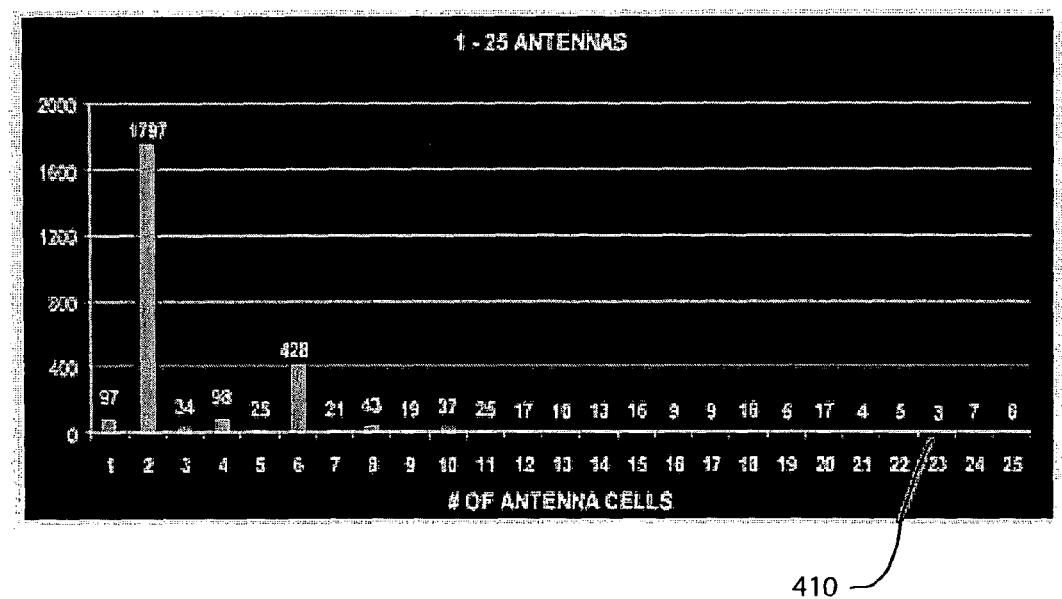
FIG. 4 shows a graph of the number of diodes as a function of a number of nets for an example device.
Figure 5:
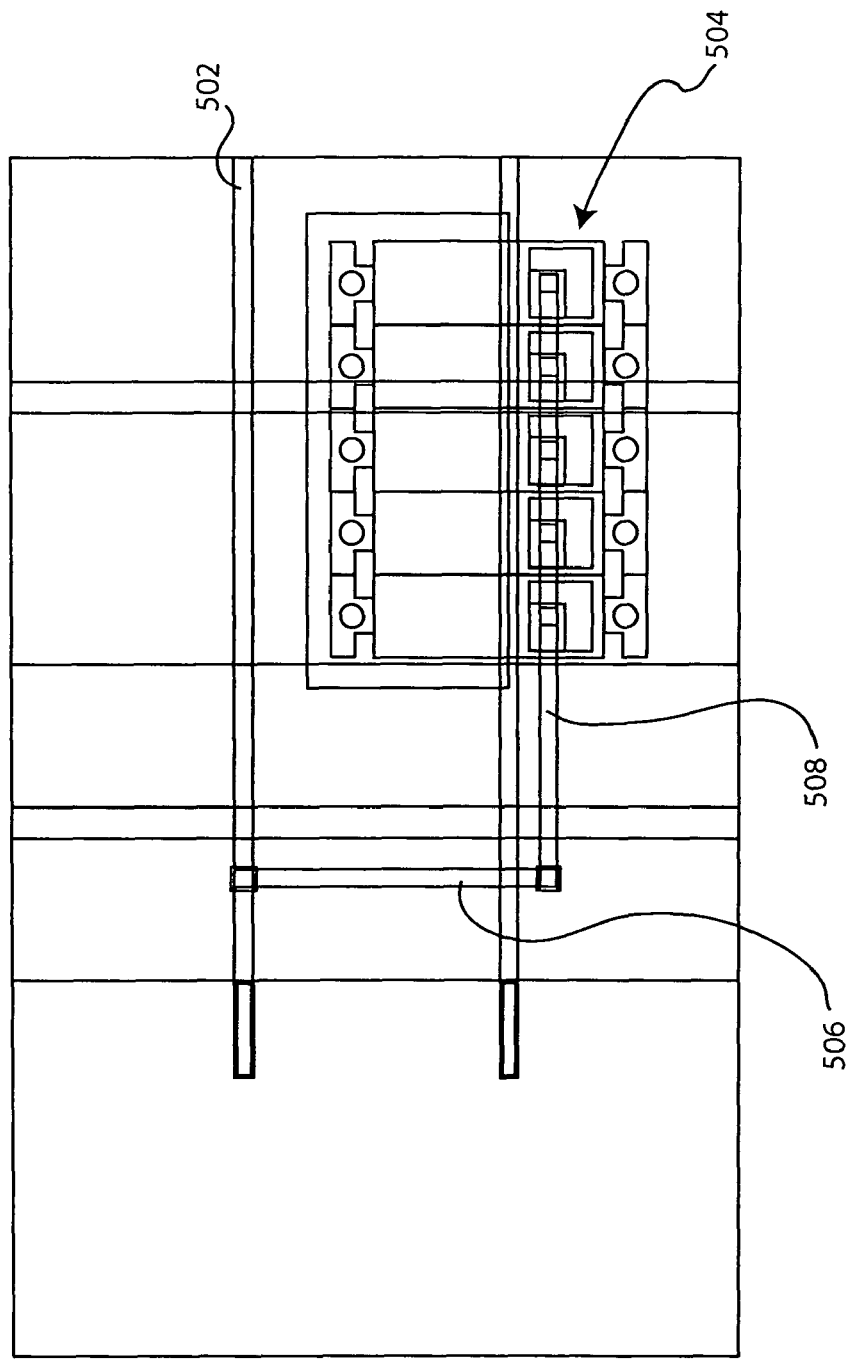
FIG. 5 schematically shows a layout of a conventional circuit for protecting gates against charge buildup.
Figure 6:
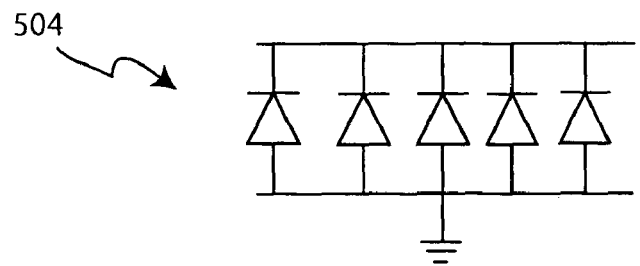
FIG. 6 shows an equivalent schematic diagram for the diode cells in the layout of FIG. 5.
Figure 10:
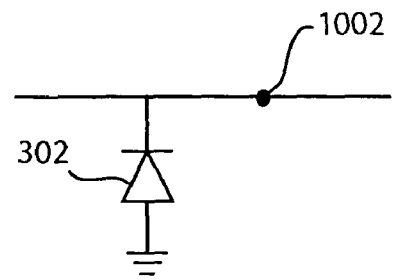
FIG. 10 shows a schematic diagram of an antenna diode for preventing charge buildup.
Figure 11:
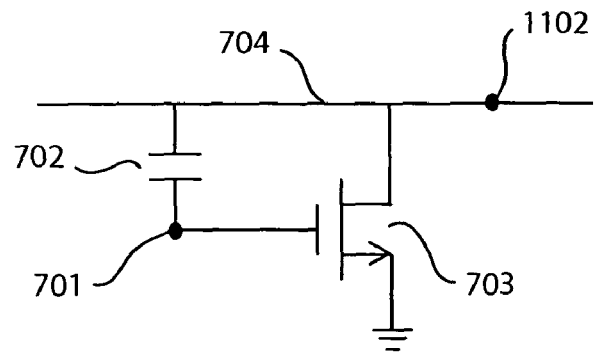
FIG. 11 shows a schematic diagram of a charge buildup protection transistor in accordance with an embodiment of the present invention.
Figure 12:
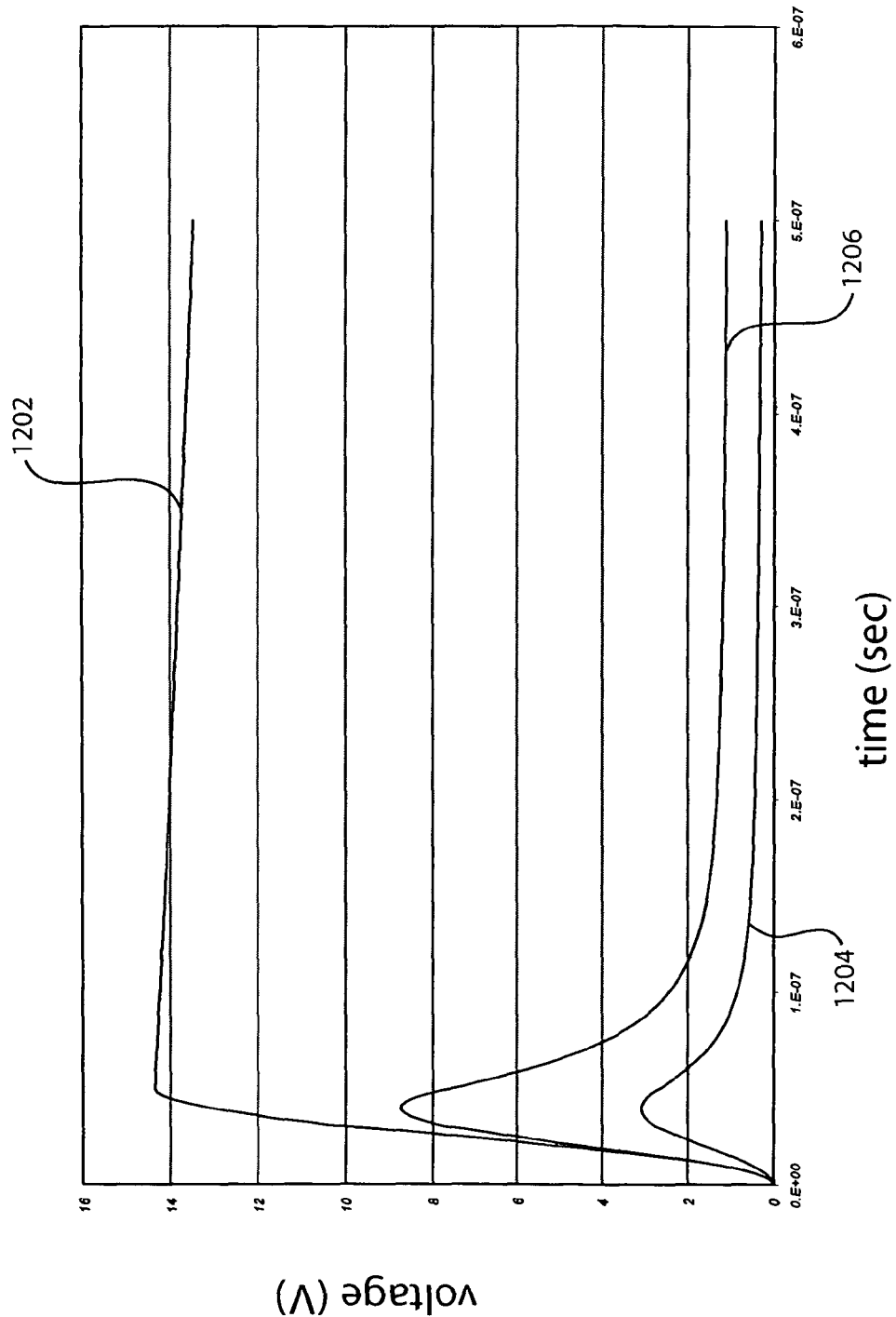
FIG. 12 shows plots of the charge protection provided by the transistor of FIG. 11 compared to the antenna diode of FIG. 10.

FIG. 12 shows plots of the charge protection provided by a charge buildup protection transistor in accordance with an embodiment of the present invention compared to a conventional diode. In the example of FIG. 12, the horizontal axis represents time and the vertical axis represents voltage. Plot 1202 is for voltage readings at a node 1002 connected to a conventional diode 302 shown in FIG. 10. Plot 1206 is for voltage readings at a node 1102 of a charge buildup protection circuit shown in FIG. 11. The charge buildup protection circuit comprises a transistor 703 and a designed-in coupling capacitor 702 (see also FIG. 7). The gate of transistor 703 is connected to coupling capacitor 702, but is otherwise floating. Node 1102 is on interconnect line 704. In FIG. 12, plot 1204 is for voltage readings on node 701 between coupling capacitor 702 and the gate of transistor 703.

As shown in FIG. 12, coupling capacitor 702 may charge to about three volts before switching ON transistor 703. That corresponds to a peak voltage of about 8.5 volts on interconnect line 1102. In marked contrast, the conventional diode allows the voltage on node 1002 to reach over 14 volts and doesn't discharge as fast as the charge buildup protection transistor. Other advantages of the charge buildup protection transistor include reduced area, current leakage, and delay while providing more protection than conventional solutions. The transistor also provides an additional degree of freedom on the controllability of the voltage required to switch its floating gate ON.

Figure 13:
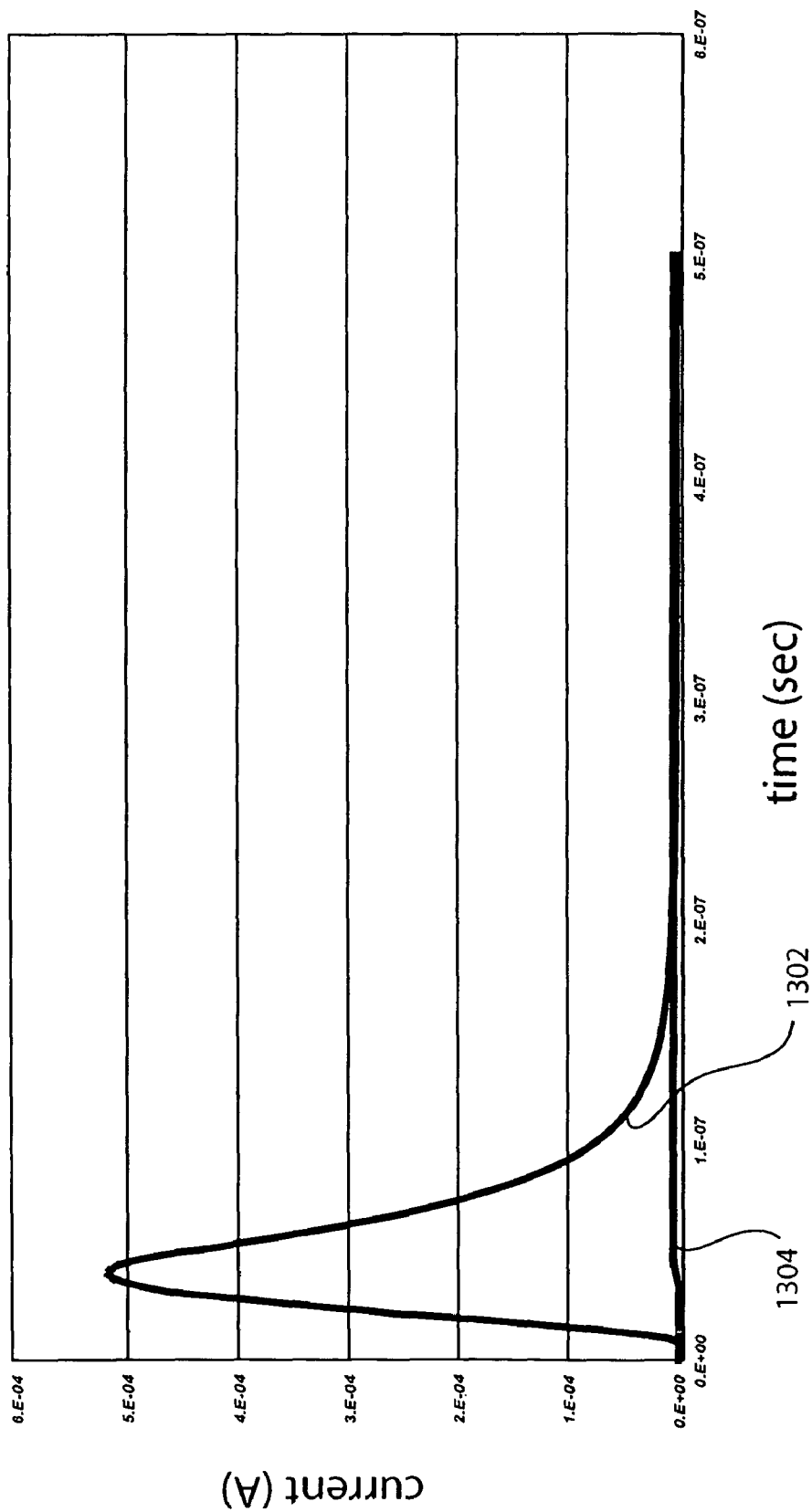
FIG. 13 shows plots of current carrying capacities of a charge protection transistor and an antenna diode.

A single small transistor can carry about 1000 times more current than a reverse biased diode (even after reverse diode breakdown). FIG. 13 shows plots of current carrying capacities over time. In FIG. 13, the horizontal axis represents time and the vertical axis represents current. Plot 1302 is for the current carrying capacity of a charge buildup protection transistor (e.g. transistor 703), while plot 1304 is for that of a conventional diode. As is evident in FIG. 13, the transistor has significantly more current carrying capacity than the diode.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit for preventing charge buildup on an interconnect line during a metallization process, the circuit comprising:
   a first transistor, a drain of the first transistor being coupled to the interconnect line, a source of the first transistor being coupled to ground; and
   a capacitor coupling the gate of the first transistor to the interconnect line, the capacitor configured to switch ON the first transistor during the metallization process and protect a gate of a second transistor when charges accumulate on the interconnect line during a metallization process,
   wherein the interconnect line is on a first metal level and is coupled to ground on a topmost metal level through a plurality of vertically stacked vias, a second metal level and the topmost metal level over the first metal level to switch OFF the first transistor.

2. The circuit of claim 1 wherein the first transistor protects the gate of the second transistor from charge buildup on the interconnect line due to physical vapor deposition.

3. The circuit of claim 1 wherein the first transistor comprises an nfet.

4. The circuit of claim 1 wherein the first transistor comprises an nfet and the second transistor comprises a MOS transistor.

5. A circuit for preventing charge buildup on an interconnect line, the circuit comprising:
   a metal line;
   a first transistor including a drain coupled to the metal line and a source coupled to ground; and
   a capacitor coupling a polysilicon gate of the first transistor to the metal line, the capacitor being configured to switch ON the first transistor during a metallization process and protect a gate of the second transistor when charges accumulate on the interconnect line during the metallization process,
   wherein the capacitor is a parasitic capacitor formed by a portion of the metal line overlying the polysilicon gate of the first transistor.

6. The circuit of claim 5 wherein the first transistor comprises an nfet and the second transistor comprises a MOS transistor.

7. The circuit of claim 5 wherein the metal line is on a first metal level and the polysilicon gate of the first transistor is coupled to ground on a topmost metal level over the first metal level.

8. The circuit of claim 7 further comprising a plurality of vertically stacked vias coupling the polysilicon gate of the first transistor to the ground on the topmost metal level.

9. The circuit of claim 1 wherein a channel length of the first transistor is at least twice a minimum channel length of the second transistor.

10. The circuit of claim 5 wherein a channel length of the first transistor is at least twice a minimum channel length of the second transistor.

11. A circuit comprising:
   a first transistor including a drain coupled through an interconnect line on a first metal level to a gate of a second transistor, a source coupled to ground, and a gate left floating;
   a capacitor coupled to the gate of the first transistor to the interconnect line, the capacitor configured to switch ON the first transistor during subsequent metallization processes and protect a gate of the second transistor when charges accumulate on the interconnect line during the metallization process; and
   a plurality of vertically stacked vias coupling the gate of the first transistor to ground at a topmost metal level to switch OFF the first transistor through at least a second metal level and the topmost metal level over the first metal level.

12. The circuit of claim 11 wherein a channel length of the first transistor is at least twice a minimum channel length of the second transistor.

* * * * *